United States Patent [19]
Jiang

[11] Patent Number: 5,351,208

[45] Date of Patent: Sep. 27, 1994

[54] CONTENT ADDRESSABLE MEMORY

[75] Inventor: Ching-Lin Jiang, Palo Alto, Calif.

[73] Assignee: Integrated Information Technology, Inc., Santa Clara, Calif.

[21] Appl. No.: 874,489

[22] Filed: Apr. 27, 1992

[51] Int. Cl.⁵ ............................................. G11C 15/00
[52] U.S. Cl. ..................................... 365/49; 365/156; 365/190
[58] Field of Search ........................... 365/49, 156, 190

[56] References Cited

U.S. PATENT DOCUMENTS

| | | | |
|---|---|---|---|
| 4,779,226 | 10/1988 | Haraszti | 365/49 |
| 4,890,260 | 12/1989 | Chuang et al. | 365/49 |
| 4,928,260 | 5/1990 | Chuang et al. | 365/49 |

Primary Examiner—Eugene R. LaRoche
Assistant Examiner—Christopher R. Glembocki
Attorney, Agent, or Firm—Skjerven, Morrill, MacPherson, Franklin & Friel

[57] ABSTRACT

A content addressable memory is provided that includes a memory cell and a first plurality of lines connected directly to the gates of access transistors to this memory cell. These access transistors are further connected to a second plurality of lines. The first and second plurality of lines each perform different functions during read, write, and comparison modes. In another embodiment of the present invention, p-channel transistors are used for a match transistor and its associated pass transistors.

20 Claims, 4 Drawing Sheets

CONTENT ADDRESSABLE MEMORY

BACKGROUND OF THE INVENTION

1. Field of the Invention

This invention relates to semiconductor memory cells, and in particular to cells suitable for use in content addressable memories in which a memory is searchable by the contents of the memory data.

2. Description of Related Art

U.S. Pat. No. 4,890,260 discloses a configuration using a content addressable memory (CAM). Referring to FIG. 1 which illustrates this configuration, the CAM cell array 11 is connected to a bit line descriptor circuit 1. Bit line descriptor circuit 1 includes a programmable bit line writing circuit, a comparand register, a mask register, and a sense amplifier (all not shown). The comparand register programs the programmable bit line writing circuit with the data to be written onto the bit lines BL and $\overline{BL}$ coupled to CAM cell array 11. Data is read from CAM cell array 11 through bit lines BL and $\overline{BL}$ with a predetermined word line WL selected. The signal on bit lines BL and $\overline{BL}$ is amplified by the sense amplifier.

Data in the mask register is used for programmable bit masking. A logic "1" in the mask register will overwrite the data in the comparand register, whereas a logic "0" in the mask register will allow the corresponding data in the comparand register to appear on the bit line for writing in a cell. Any or all bits can be masked in this manner.

Descriptor circuit 1 exchanges data with bit bus 10. A row decoder 2 is connected to CAM cell array 11 by a plurality of word lines WL for selecting different words in the array. A bit line precharge circuit 3, which precharges the bit lines to the optimal levels for high speed cell reading, is connected to CAM cell array 11 through a plurality of bit lines BL' and $\overline{BL}'$. CAM cell array 11 is connected to a word masking and reset circuit 4, match detector 5, and priority encoder 6 via a plurality of match lines ML.

Word masking and reset circuit 4 masks any or all words with an empty or skip bit. The entire array is reset by resetting all the empty bits. Both of these operations are well-known in the art and, therefore, are not explained in further detail. Match detector 5 detects a "no match" or "match" condition. Priority encoder 6 encodes the address of the location in CAM cell array 11 when a "match" condition occurs.

The control logic 7 provides inputs to word masking and reset circuit 4, match detector 5, and priority encodes 6 in response to instructions received from bus 10. Specifically, instructions received from bus 10 generate the appropriate internal timings to accomplish the operations of each circuit.

A typical content addressable memory cell, shown in FIG. 2, comprises nine transistors. Transistors 206–209 form a memory cell 216. Information is stored in the form of voltage levels in memory cell 216. Memory cell 216 has two states: logic state "0" and logic state "1". For example, if logic state "0" is designated by node 204 having a high voltage and node 205 having a low voltage, then logic state "1" has the opposite stored voltages, i.e. node 204 having a low voltage and node 205 having a high voltage.

In logic state "0" the high voltage on node 204 turns on N-channel transistor 209 and turns off P-channel transistor 207. The low voltage applied to node 205 turns on P-channel transistor 206 and turns off N-channel transistor 208. The voltage on node 204 remains high because current flows through transistor 206 from voltage source Vdd, which is typically 5 volts. The voltage on node 205 remains low because current flows through transistor 209 to voltage source Vss (typically ground).

In logic state "1" the transistors which were on in the logic "1" state are now off, and the transistors which were off are now on, thereby providing a low voltage on node 204 and a high voltage on node 205. Node 204 remains low as current flows through transistor 208 to voltage source Vss (ground), while node 205 now remains high as current flows from voltage source Vdd through transistor 207. Thus, both logic states are stable with neither branch 216A, including transistors 206 and 208, nor branch 216B, including transistors 207 and 209, conducting.

To read memory cell 216, bit lines 200 and 201 are precharged to a high voltage. Transistors 202 and 203 are subsequently turned on by a high voltage on word line 215. The logic state stored by memory cell 216 pulls one bit line, 200 or 201, low. For example, if memory cell 216 is in logic state "1" with a low voltage on node 204 and a high voltage on node 205, then bit line complement 200 is discharged through transistors 202 and 208 to ground. Bit line 201 remains charged. The difference in voltage between bit lines 200 and 201 is then sensed.

To write a logic state in the memory cell 216, data is placed on bit line 200 and data complement ("$\overline{\text{data}}$") is placed on bit line complement 201. Applying a high voltage to word line 215 turns on transistors 202 and 203, thereby transferring data and $\overline{\text{data}}$ to nodes 204 and 205, respectively. This voltage transfer drives memory cell 216 into the desired configuration.

During a comparison operation, data is placed on bit line 201 and $\overline{\text{data}}$ is placed on bit line complement 200. For example, assume memory cell 216 stores a logic "0". A match fail condition results when a low voltage and a high voltage are provided on bit lines 200 and 201, respectively, in the comparison mode. To ensure transistors 202 and 203 remain off, the voltage on word line 215 remains low. The high voltage stored on node 204 is applied to the gate of N-channel pass transistor 211, thereby turning on pass transistor 211. The low voltage on node 205 is applied to N-channel pass transistor 210. Therefore, pass transistor 210 remains off. Thus, with transistor 211 on, data (i.e. a high voltage) on bit line 201 is applied to the gate of N-channel transistor 213, thereby turning on this transistor as well. Because transistor 213 turns on, current flows through transistor 213 to voltage source Vss (ground), thereby discharging the voltage on match line 214 which was precharged for the comparison operation. Thus, in summary, if the data match those in memory cell 216, then match line 214 remains charged. If memory cell has data that do not match, match transistor 213 turns on and discharges match line 214.

A drawback of the above-described content addressable memory is that the bit lines must be discharged to zero to prepare for a comparison operation. Therefore, a need arises for an improved content addressable memory.

Another drawback is the large number of transistors required, nine in this configuration, which introduces an undesirable increase in the size of the array. Therefore, a need also arises for a smaller content addressable memory.

SUMMARY OF THE INVENTION

In one embodiment of the present invention, a content addressable memory is provided which uses P-channel transistors, instead of N-channel transistors, for the match transistor and its associated pass transistors. This embodiment provides greater performance than the prior art because the match line can be conditioned during a read operation.

In another embodiment of the present invention, a content addressable memory eliminates the match transistor and its associated pass transistors previously required. The content addressable memory in this embodiment comprises a memory cell, access transistors, a first plurality of lines that function as word lines during a write operation, as bit lines during a read operation, and as match lines during a comparison operation; and a second plurality of lines that function as bit lines during a write operation, as word lines during a read operation, and as bit lines during a comparison operation.

During a write mode, the first plurality of lines are set to zero volts. Then, one of the second plurality of lines is driven to a high voltage, thereby setting the memory cell to a predetermined logic state. To later read this logic state, both lines in the second plurality are increased to a high voltage, thereby turning on the access transistors. The particular voltages stored in the memory cell are then transferred via these access transistors to the first plurality of lines. The differential voltage between these lines is subsequently detected.

During a comparison mode, the first plurality of lines are precharged to a high voltage. Then the voltages on both lines in the second plurality are driven to a high voltage, thereby turning on the access transistors. In this manner, the voltage on one of the first plurality of lines is pulled down by the memory cell. Convention establishes which pull down is termed a match condition.

In another embodiment, a plurality of content addressable memories are connected to the first plurality of lines.

DETAILED DESCRIPTION OF THE DRAWINGS

Figure 3:
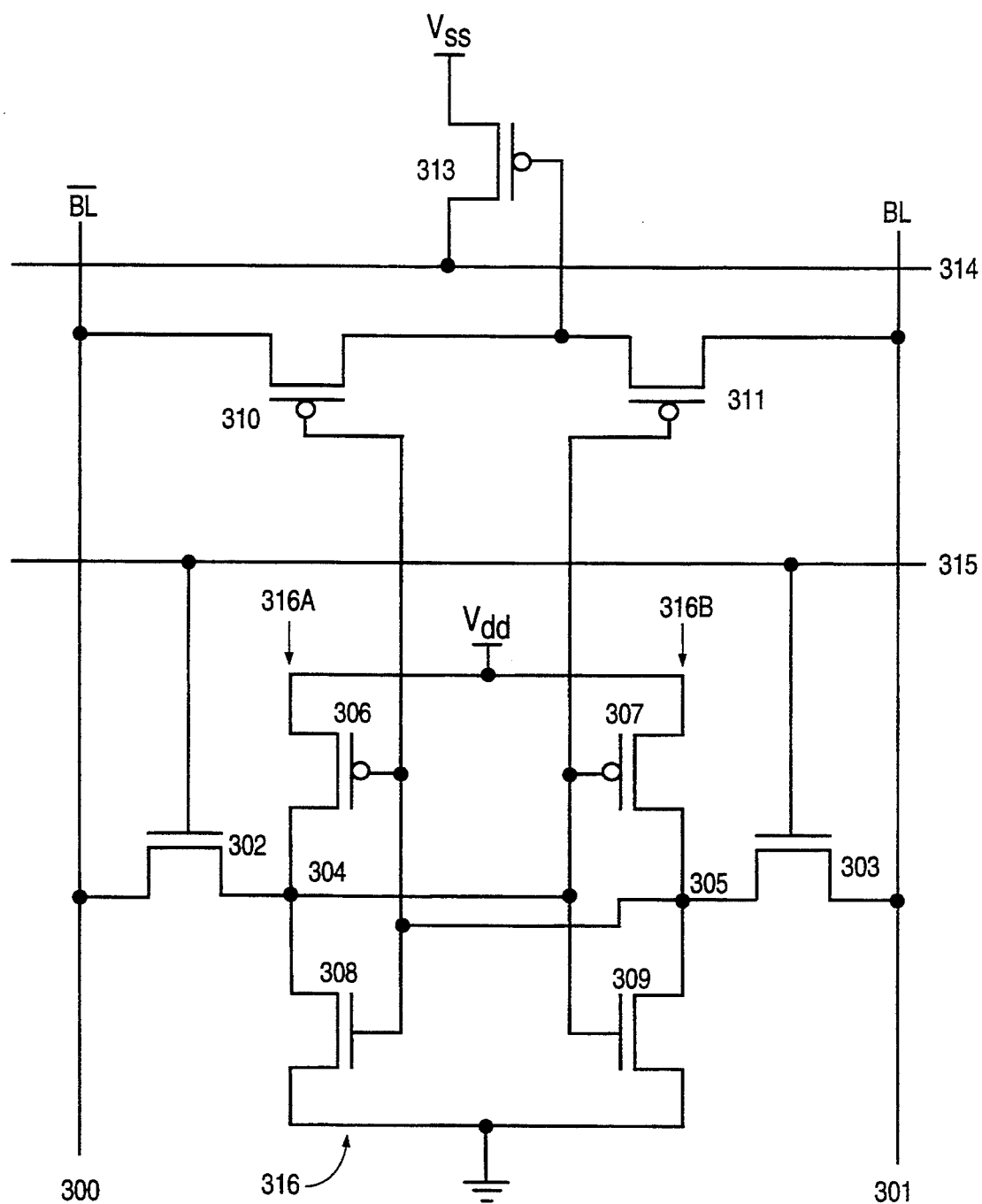
FIG. 3 illustrates a component-level schematic diagram of a content addressable memory in accordance with the present invention.

The memory cell illustrated in FIG. 3 provides high performance in content addressable memories.

The width and length of the transistors in FIG. 3 is set forth in Table 1, in which the first number is channel width in microns and the second number is channel length in microns.

TABLE 1

| 302 (7:5) | 303 (7:5) | 306 (7:7) |
| 307 (7:7) | 308 (16:4) | 309 (16:4) |

TABLE 1-continued

| 310 (10:4) | 311 (10:4) | 313 (10:4) |

Figure 1:
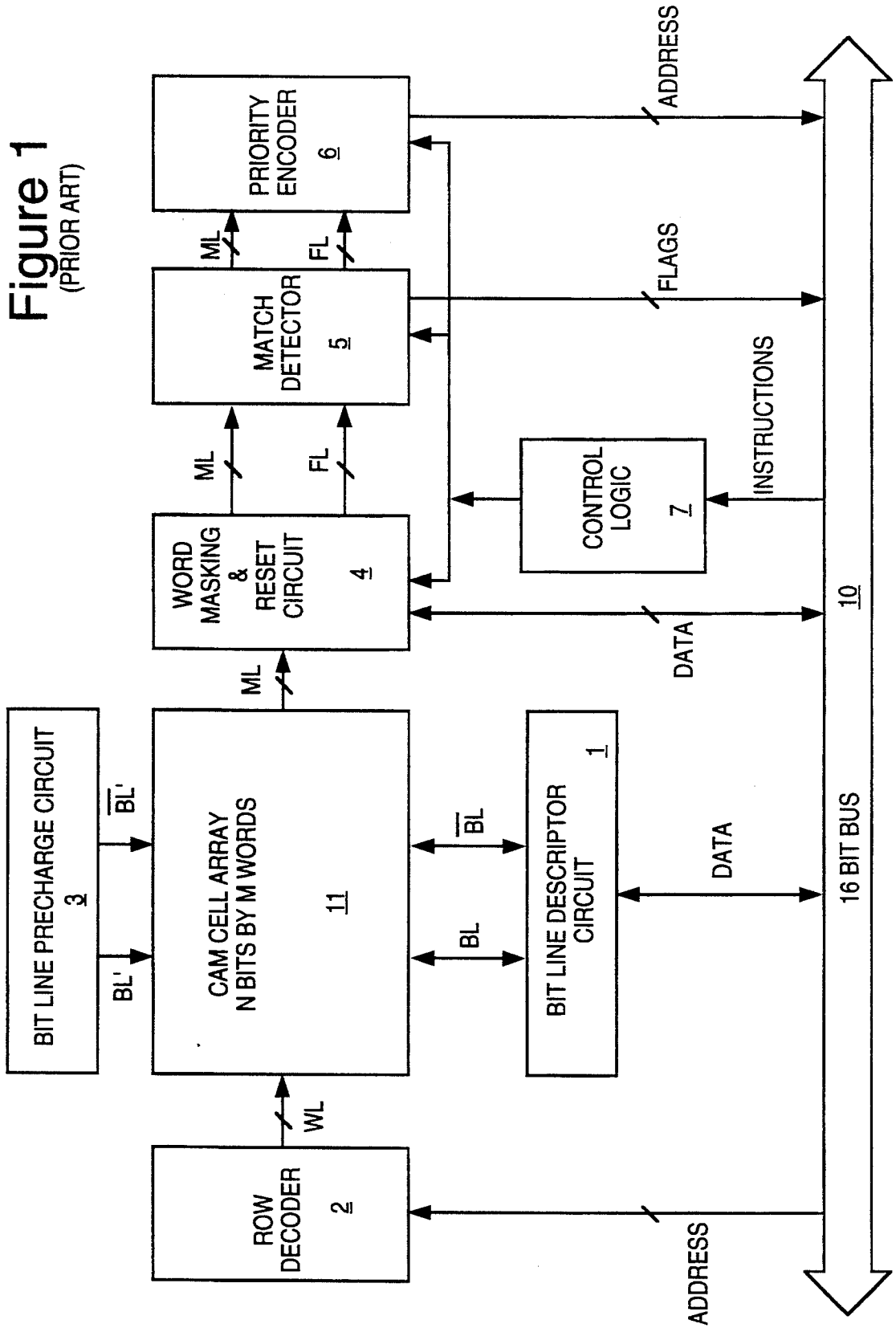
FIG. 1 illustrates a block diagram of a prior art configuration having a content addressable memory.
Figure 2:
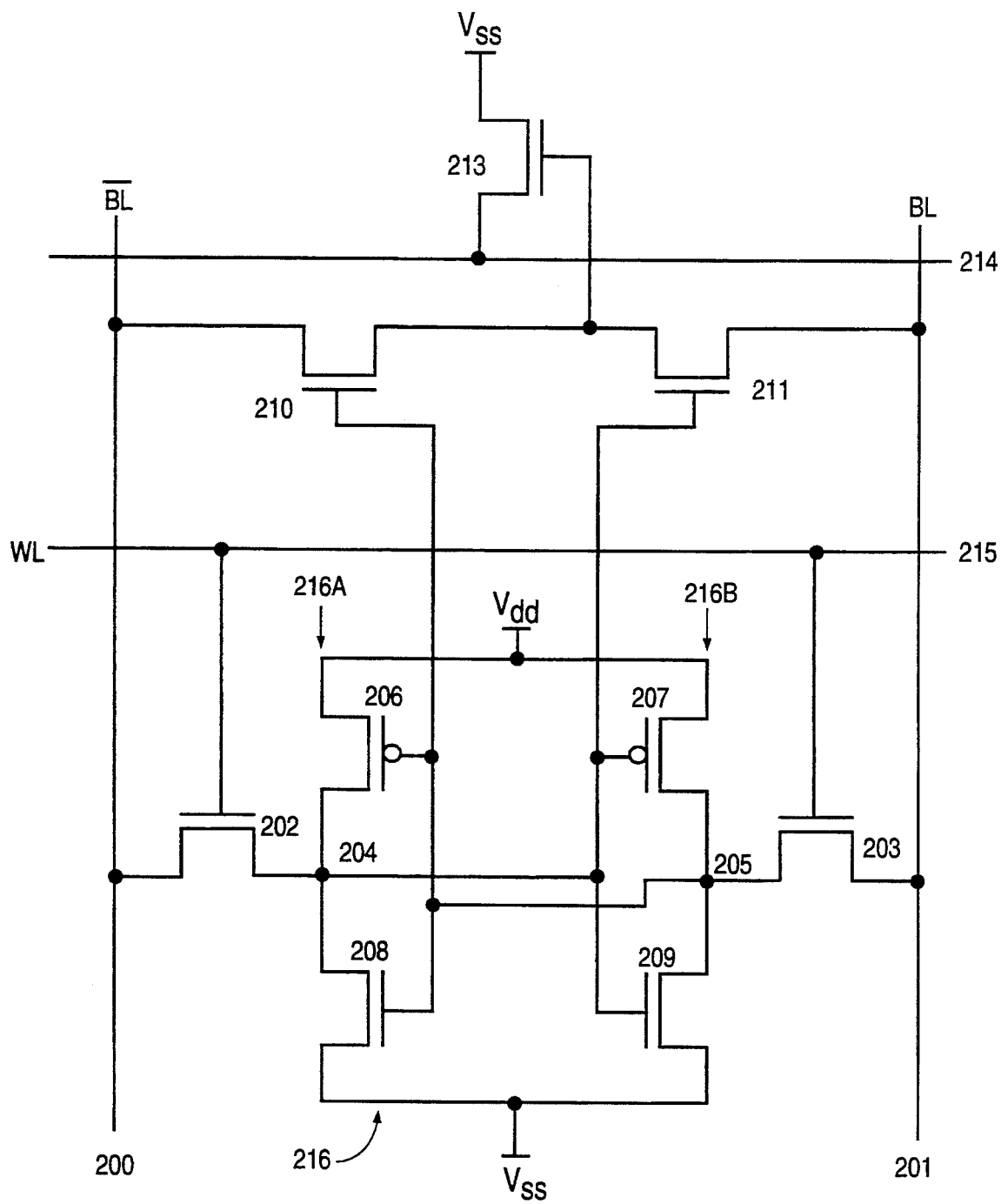
FIG. 2 illustrates a component-level schematic diagram of a typical prior art content addressable memory.

Memory cell 316 functions similarly to memory cell 216 in FIG. 2 during read and write operations.

During a comparison operation, data is placed on bit line 301 and $\overline{\text{data}}$ is placed on bit line complement 300. For example, assume memory cell 316 is storing a logic "0". A match fail condition results when low voltage and a high voltage are provided on bit lines 300 and 301, respectively, in the comparison mode. Note transistors 302 and 303 remain off because of a low voltage on word line 315. The high voltage on node 304 is applied to the gate of P-channel pass transistor 311, thereby turning off pass transistor 311. The low voltage on node 305 is applied to P-channel pass transistor 310, thereby turning on pass transistor 310. Thus, with transistor 310 on, data (i.e. a low voltage) on bit line 300 is applied to the gate of P-channel transistor 313, thereby turning on this transistor as well. Because transistor 313 turns on, current flows from voltage source Vdd (typically 5.0 V) through transistor 313, thereby pulling up the voltage on match line 314 which is uncharged during the beginning of the comparison operation. Note that in one illustrative application, only the match lines 314 of the match fail cells are pulled up. Thus, in summary, if the data do not match those in memory cell 316, then match line 314 is precharged. If memory cell has data that match, match line 314 is not precharged.

Note that a compare operation following a read operation is done immediately, without need to condition bit lines 300 and 301 for match line 314, which yields higher performance. This is because when data is read, both bit lines 300 and 301 are charged, differing only by a very slight amount Δ on the order of 20–50 millivolts. Hence, the bit line at logic state "1" is Vbias, and the bit line at logic state "0" is Vbias-Δ. If Vbias (Vbias is about Vdd-Vth, where Vth is dependent on the sense amplifier design) is about 4 volts, the voltage values on bit lines 300 and 301 are about 4 volts and just slightly under about 4 volts. Because the voltage on the gate of transistor 313 is never sufficiently low during a read operation to turn on transistor 313, match line 314 can prepared during the read operation, thereby providing a high performance capability.

Figure 4:
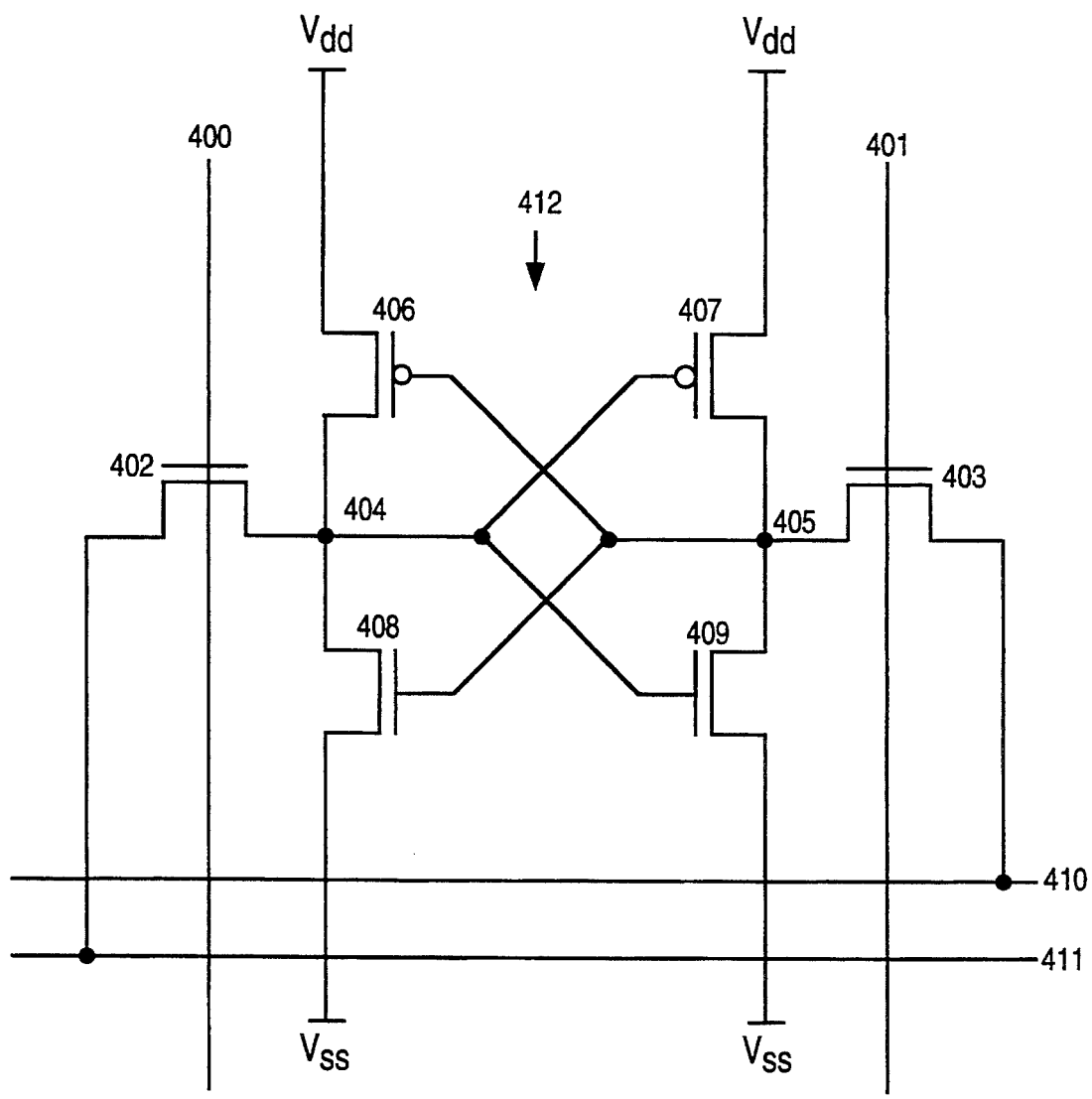
FIG. 4 illustrates a component-level schematic diagram of another embodiment of a content addressable memory in accordance with the present invention.

Another content addressable memory cell is illustrated in FIG. 4. P-channel MOSFET transistors 406 and 407 and N-channel MOSFET transistors 408 and 409 are formed in a standard memory cell configuration. Specifically, the sources of transistors 406 and 407 are connected to supply voltage Vdd, the drains of these transistors are connected to the drains of transistors 408 and 409, respectively, and the sources of transistors 408 and 409 are connected to another voltage source Vss. Typically, voltage source Vss is ground and the voltage source Vdd is five volts. The gates of transistors 406 and 408 are connected to node 405, which is located between the drains of transistors 407 and 409, whereas the gates of transistors 407 and 409 are connected to node 404, which is located between the drains of transistors 406 and 408.

Access transistor 402 is formed between node 404 and line 411, while access transistor 403 is formed between node 405 and line 410. Lines 410 and 411 are word lines for a write, bit lines for a read, and match lines for a comparison operation. In this embodiment, access transistors 402 and 403 are N-channel MOSFET transistors.

Lines 400 and 401 are directly connected to the gates of transistors 402 and 403, respectively. Lines 400 and 401 are bit lines for a write, word lines for a read, and bit lines for a comparison operation.

During a write to a selected cell, the voltages on lines 410 and 411 are set to zero. If the cell is not selected, lines 410 and 411 are left floating. Then, one bit line, for example bit line 400, is made high while the other bit line 401 is made low. In this manner, access transistor 402 is turned on, thereby transferring the low voltage on line 411 to node 404 which, as mentioned previously, is connected to the gates of transistors 407 and 409. Thus, this voltage subsequently turns on transistor 407 and turns off transistor 409. Because transistor 407 is on, a current flows from voltage source Vdd through transistor 407 to pull up the voltage on node 405 which, as also mentioned previously, is connected to the gates of transistors 406 and 408. A high voltage on node 405 turns off transistor 406, but turns on transistor 408. With transistor 408 on, current flows through transistor 408 to ground, thereby maintaining a low voltage on node 404. Thus, the present invention effectively programs memory cell 412.

During a read of memory cell 412, the voltages on lines 400 and 401 are driven high, thereby turning on access transistors 402 and 403, which in turn transfer the voltages on nodes 404 and 405 to lines 411 and 410, respectively. Thus, the voltages on lines 410 and 411 reflect the logic state of memory cell 412.

Finally, during a comparison mode, lines 410 and 411 are precharged to a high voltage. Then, data and $\overline{\text{data}}$ are applied to lines 401 and 400. If a match fail occurs, the voltage on one of the two word/match lines will be pulled down by memory cell array 412. For example, if memory cell 412 stores a logic "1" state, then node 404 has a low voltage and node 405 has a high voltage. Assume line 400 is high and line 401 is low. This is a match fail condition. Access transistor 403 does not turn on, so the voltage on line 410 remains high. However, when access transistor 402 turns on, transistor 408 (which is also on) pulls down line 411. Hence, a match fail is signalled. On the other hand, if line 400 is low and line 401 is high, transistor 403 turns on and applies high voltage to line 410. Transistor 402 remains off, so line 411 remains precharged. As both lines 410 and 411 are high, a match is signalled.

It will be appreciated that in practice, a plurality of memory cells are connected to lines 410 and 411 as memory cell 412 is connected in FIG. 4. The same conventions apply.

Therefore, the match transistor and its associated pass transistors of the prior art have been eliminated, thereby permitting a substantial size reduction of the memory cell array. In further accord, the match lines and word lines of the content addressable memory of FIG. 2 have been combined which further reduces the total size of the memory cell array. A content addressable memory cell in accordance with the present invention is reduced in size by 40% as compared to a typical prior art memory cell.

While the invention has been described with respect to certain embodiments, the scope of the present invention is defined by the appended claims and is not necessarily limited to the embodiments herein, which are merely illustrative. Accordingly, other embodiments and variations not described herein may be within the scope of the invention, as defined by the appended claims.

What is claimed is:

1. A content addressable memory operable at different times in respectively a read mode, a write mode, and a compare mode, comprising:
    a memory cell for storing a logic state;
    a first plurality of lines which function as word lines during the write mode, as bit lines during the read mode, and as match lines during the comparison mode;
    a plurality of switching devices for controllably connecting the memory cell to the first plurality of lines in accordance with logic states on respective control terminals thereof; and
    a second plurality of lines respectively coupled to the control terminals of the switching devices, the second plurality of lines functioning as bit lines during the write mode, as word lines during the read mode, and as bit lines during the comparison mode.

2. The content addressable memory of claim 1 wherein said plurality of switching devices are N-channel transistors having drains, sources, and gates.

3. The content addressable memory of claim 2 wherein said second plurality of lines are coupled to said gates of said N-channel transistors.

4. A content addressable memory operable at different times in respectively a read mode, a write mode, and a compare mode, comprising:
    a memory cell including:
    a first transistor, a source of the first transistor coupled to a first voltage source;
    a second transistor, a drain of the second transistor coupled to a drain of the first transistor, a source of the second transistor coupled to a second voltage source;
    a third transistor, a source of the third transistor coupled to the first voltage source;
    a fourth transistor, a drain of the fourth transistor coupled to a drain of the third transistor, a source of the fourth transistor coupled to the second voltage source,
    wherein the drains of the first and second transistors are further coupled to a gate of the third transistor and a gate of the fourth transistor, and the drains of the third and fourth transistors are further coupled to a gate of the first transistor and a gate of the second transistor;
    a fifth transistor, a source/drain of the fifth transistor coupled to the drains of the first and second transistors;
    a sixth transistor, a source/drain of the sixth transistor coupled to the drains of the third and fourth transistors;
    wherein the fifth transistor and the sixth transistor are of identical conductivity types;
    a first line coupled to a gate of the fifth transistor, the first line functioning as a bit line during the write mode, as a word line during the read mode, and as a bit line during the compare mode;
    a second line coupled to a gate of the sixth transistor, the second line functioning as a bit line during the write mode, as a word line during the read mode, and as a bit line during the compare mode; and
    a third line coupled to the drain/source of the fifth transistors the third line functioning as a word line during the write mode, as a bit line during the read mode; and as a match line during the compare mode; and a fourth line coupled to the drain/source of the sixth transistor, the fourth line functioning as a word line during the write mode, as a bit line during the read mode, and as a match line during the compare mode.

5. The content addressable memory of claim 4 wherein said first and third transistors are P-channel transistors.

6. The content addressable memory of claim 5 wherein said second and fourth transistors are N-channel transistors.

7. The content addressable memory of claim 4 wherein the state of the fifth and sixth transistors determines whether voltages are transferred between the third and fourth lines, and the memory cell.

8. A content addressable memory comprising:
a memory cell;
a plurality of access transistors connected to the memory cell;
a plurality of pass transistors connected to the memory cell so that a logic state of the memory cell controls the conductivity of respective data paths through the pass transistors; and
a match transistor connected to the data paths of the pass transistors for determining a match condition,
wherein the plurality of pass transistors and the match transistor are p-channel transistors so that the match transistor is off when a read precharge voltage greater than or equal to a source voltage minus a threshold voltage of the match transistor is applied thereto through at least one of the data paths.

9. A content addressable memory comprising:
a memory cell having a true output and a complement output;
a match line;
a first p-channel field effect transistor having a source connected to a pullup voltage node, a drain connected to the match line, and a gate;
a true bit line;
a complement bit line;
a second p-channel field effect transistor having a source/drain connected to the true bit line, a drain/source connected to the gate of the first transistor, and a gate connected to the complement output of the memory cell; and
a third p-channel field effect transistor having a source/drain connected to the complement bit line, a drain/source connected to the gate of the first transistor, and a gate connected to the true output of the memory cell;
wherein the true bit line and the complement bit line receive a precharge voltage greater than or equal to a source voltage minus a threshold voltage of the first p-channel field effect transistor during a read operation, the precharge voltage being applied to the first p-channel field effect transistor through one of the second and third p-channel field effect transistors so that the first p-channel transistor is off during the read operation.

10. A content addressable memory as in claim 9 further comprising:
a first n-channel field effect transistor having a source/drain connected to the true output of the memory cell, a drain/source connected to the true bit line, and a gate;
a second n-channel field effect transistor having a source/drain connected to the complement output of the memory cell, a drain/source connected to the complement bit line, and a gate;
a word line connected to the gate of the first n-channel field effect transistor and to the gate of the second n-channel field effect transistor.

11. A content addressable memory comprising:
a memory cell for storing a logical value and having a true output for furnishing a true of the stored logical value, and a complement output for furnishing a complement of the stored logical value;
a match line;
a first switch having a first current terminal coupled to a pullup voltage node, a second current terminal coupled to the match line, and a control terminal for controlling conduction between the first and second current terminals;
a true bit line;
a complement bit line;
a second switch having a first current terminal coupled to the true bit line, a second current terminal coupled to the control terminal of the first switch, and a control terminal coupled to the complement output of the memory cell for placing the second switch into a conductive condition when the stored logical value is a logical one so that a read precharge voltage on the true bit line is of a value relative to a voltage on the pullup voltage node that places the first swatch in an open position to permit match line conditioning and a logical one on the true bit line places the first switch in an open position to indicate a match condition, and so that a logical zero on the true bit line places the first switch in a closed position to pull up the match line to indicate a match fail condition; and
a third switch having a first current terminal coupled to the complement bit line, a second current terminal coupled to the control terminal of the first switch, and a control terminal coupled to the true output of the memory cell for placing the third switch into a conductive condition when the stored logical value is a logical zero so that a read precharge voltage on the complement bit line is of a value relative to a voltage on the pullup voltage node that places the second switch in an open position to permit match line conditioning and a logical one on the complement bit line places the first switch in an open position to indicate a match condition, and so that a logical zero on the complement bit line places the first switch in a closed position to pull up the match line to indicate a match fail condition.

12. A content addressable memory as in claim 11 further comprising:
word line means coupled to the memory cell to select the memory cell for a memory write or read;
means coupled to the memory cell for writing to the memory cell; and
means coupled to the memory cell for reading from the memory cell.

13. A content addressable memory as in claim 12 further comprising:
means for precharging the true and complement bit lines to a logical one prior to a memory read, whereby the first switch is placed in an open position; and
means for discharging the match line so that the match line is preset to indicate a match condition.

14. A content addressable memory as in claim 13 further comprising means for operating the precharging means and the discharging means concurrently.

15. A content addressable memory comprising:
   a memory cell having a plurality of storage nodes;
   a plurality of access devices, the access devices having a control terminal, and the access devices having a conduction path coupled to the storage nodes;
   a first plurality of lines coupled to the conduction path of the access devices, the first plurality of lines function as word lines during a write mode, as bit lines during a read mode, and as match lines during a comparison mode; and
   a second plurality of lines coupled to the terminals of the access devices, the second plurality of lines function as bit lines during the write mode, as word lines during the read mode, and as bit lines during the comparison mode.

16. The content addressable memory of claim 15 wherein the access devices are a first n-channel field effect transistor having a channel, a drain, a source, and a gate, and a second n-channel field effect transistor having a channel, a drain, a source, and a gate, and the first plurality of lines are a first line and a second line, the first line is coupled to the drain/source of the first n-channel field effect transistor and the second line is coupled to the drain/source of the second n-channel field effect transistor.

17. A content addressable memory comprising:
   a memory cell having a first storage node and a second storage node;
   a first switch having a conductivity type, a control terminal, and having a conduction path coupled to the first storage node;
   a second switch having a conductivity type identical to the conductivity type of the first switch, having a control terminal, and having a conduction path coupled to the second storage node;
   a first line coupled to the conduction path of the first switch, the first line functioning as a word line during a write mode, as a bit line during a read mode, and as a match line during a comparison mode;
   a second line coupled to the conduction path of the second switch, the second line functioning as a word line during the write mode, as a bit line during the read mode, and as a match line during the comparison mode;
   a third line coupled to the control terminal of the first switch, the third line functioning as a bit line during the write mode, as a word line during the read mode, and as a bit line during the comparison mode; and
   a fourth line coupled to the control terminal of the second switch, the fourth line functioning as a bit line during the write mode, as a word line during the read mode, and as a bit line during the comparison mode.

18. The content addressable memory of claim 17 wherein the first switch and the second switch are n-channel field effect transistors.

19. A content addressable memory operable at different times in respectively a read mode, a write mode, and a compare mode, comprising:
   a memory cell having a true signal node and a complement signal node;
   a first switch having a first current terminal coupled to the true signal node of the memory cell, a second current terminal, and a control terminal;
   a second switch having a first current terminal coupled to the complement signal node of the memory cell, a second current terminal, and a control terminal;
   first and second control lines coupled to the control terminals of the first and second switches respectively, the first and second control lines being true and complement bit lines respectively during the write mode, collectively a word line during the read mode, and true and complement bit lines respectively during the compare mode; and
   first and second current lines coupled respectively to the second current terminals of the true and complement signal switches respectively, the first and second current lines being collectively a word line during the write mode, true and complement bit lines respectively during the read mode, and collectively a match line during the compare mode.

20. A content addressable memory as in claim 19 further comprising:
   a means for selecting the content addressable memory, wherein:
   the first and second control lines having a logical one and a logical zero respectively during write mode when selected, collectively a logical one during read mode when selected, and a logical one and a logical zero respectively during compare mode when selected; and
   the first and second current lines having, collectively, a logical zero during write mode when selected and floating when not selected, having a logical one and a logical zero during read mode when selected, and collectively precharged during compare mode when selected and indicating a mismatch when at least one of the first and second current lines is subsequently pulled down.

* * * * *